United States Patent
Zhang et al.

(10) Patent No.: US 9,795,068 B2
(45) Date of Patent: Oct. 17, 2017

(54) ELECTRONIC DEVICE

(71) Applicant: LENOVO (BEIJING) CO., LTD., Beijing (CN)

(72) Inventors: Jun Zhang, Beijing (CN); Zicheng Huang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 330 days.

(21) Appl. No.: 14/225,131

(22) Filed: Mar. 25, 2014

(65) Prior Publication Data
US 2014/0293522 A1  Oct. 2, 2014

(30) Foreign Application Priority Data

Mar. 29, 2013 (CN) .......................... 2013 1 0109867

(51) Int. Cl.
*H05K 7/14* (2006.01)
*H05K 9/00* (2006.01)

(52) U.S. Cl.
CPC .................. *H05K 9/0054* (2013.01)

(58) Field of Classification Search
CPC .............. H05K 7/14; H05K 9/0054
USPC ...................................... 361/679.21
See application file for complete search history.

(56) References Cited

U.S. PATENT DOCUMENTS 5,820,189 A * 10/1998 Tew .................. B60P 3/341
296/157
6,560,124 B1 * 5/2003 Irie ...................... H05K 5/02
174/377
2007/0099457 A1 * 5/2007 Beno .................. G09F 1/10
439/135
2008/0284219 A1 * 11/2008 Koontz, II ........... B60N 2/4876
297/220
2012/0268891 A1 * 10/2012 Cencioni ............. G06F 1/1626
361/679.55

FOREIGN PATENT DOCUMENTS

CN         2011261501 U  *  8/2011

OTHER PUBLICATIONS

Chinese Patent Application CN 201310109867.6, Chinese Patent Office, First Office Action dated May 26, 2016; 8 pages.
English Text Translation of Chinese Patent Application CN 201310109867.6, Chinese Patent Office, First Office Action dated May 26, 2016; 7 pages.
Chinese Patent Application CN 201310109867.6, Chinese Patent Office, Second Office Action dated Nov. 7, 2016; 7 pages.
English Text Translation of Chinese Patent Application CN 201310109867.6, Chinese Patent Office, Second Office Action dated Nov. 11, 2016; 7 pages.

* cited by examiner

*Primary Examiner* — Eric Thomas
*Assistant Examiner* — Michael P McFadden
(74) *Attorney, Agent, or Firm* — Dentons US LLP; Peter Su

(57) ABSTRACT

An electronic device is provided, comprising a display panel, a frame, wherein the display panel is fixed to the frame; and an elastic cover, wherein the elastic cover covers a first side, opposite to the display panel, of the frame. According to the present invention, the elastic cover is used as one part of the electronic device forming part of the product.

18 Claims, 5 Drawing Sheets

ELECTRONIC DEVICE

CROSS REFERENCE TO RELATED APPLICATIONS

This application claims the benefit under 35 U.S.C. §119(a) of Chinese Patent Application No. 201310109867.6, filed on Mar. 29, 2013, the entire disclosure of which is incorporated by reference herein in its entirety.

TECHNICAL FIELD

The present disclosure relates to an electronic device, and more particularly to an electronic device including a display panel.

BACKGROUND

As electronic devices become more and more popular, people's requirements on electronic devices are not limited to the improvements of the functions of these electronic devices, but they also include the appearance and maintaining convenience of the electronic devices.

Conventional electronic devices, such as computer displays, televisions and the like, substantially use materials with high rigidity, such as plastic, metal, glass, or the like, for the outer casing. The appearance of the casing is monotonous, and this casing cannot be easily removed or replaced, so it is not convenient to maintain internal components of electronic device for maintenance.

SUMMARY

According to an embodiment of the present invention, an electronic device is provided, comprising a display panel, a frame, wherein the display panel is fixed to the frame, and an elastic cover, wherein the elastic cover covers a first side, opposite to the display panel, of the frame.

The frame supports the elastic cover so that component accommodating space is formed between the elastic cover and the frame.

The electronic device further comprises at least one internal component attached to the display panel or the frame, and the at least one internal component is accommodated in the component accommodating space.

The electronic device further comprises at least one internal component attached to the display panel or the frame, and the frame exposes the at least one internal component to the elastic cover.

The electronic device further comprises at least one internal component attached to the display panel or the frame, and the at least one internal component is shielded by the elastic cover.

The elastic cover is formed of elastic woven material.

The elastic woven material is woven with metal wires.

The frame has ribs protruding to the elastic cover to support the elastic cover.

The elastic cover body is provided with zippers.

According to some embodiments, the zippers comprise four zippers arranged into two parallel lines and the elastic cover is provided with a slit, which connects the respective adjacent positions of the two zippers forming each one of the two parallel lines.

The frame is provided with two parallel ribs protruding towards the elastic cover at positions corresponding to the slits and the ribs support the elastic cover.

The elastic cover has braces provided along each of the two edges of the slit and the braces can be embedded and fixed between the two parallel ribs of the frame.

The electronic device further comprises a support base, which comprises a support arm connected to the frame of the display component, and the support arm is connected to the frame between the two parallel ribs.

The zippers of the elastic cover are arranged in the "I"-shape.

The frame is provided with two parallel ribs protruding towards the elastic cover at the position corresponding to the "|" of the "I" shape of the zipper.

According to other embodiments, the electronic device further comprises a support base, which comprises a support arm connected to the frame of the display component, and the support arm penetrates the portion of the elastic cover where the zipper is provided.

The frame of the display component is connected to the support arm of the support base with a connection mechanism and the elastic cover covers the connection mechanism.

According to other embodiments, the elastic cover comprises an edge covering part covering the edge part of the second side, opposite to the first side of the frame, on the display panel or the frame.

The electronic device may further comprises screen glass, which covers the display panel to sandwich the edge covering part of the elastic cover between the screen glass and the display panel or frame.

A magnetic strip is stuck to the screen glass and the screen glass covers the display panel with the magnetic attraction between the magnetic strip and the frame.

BRIEF DESCRIPTION OF THE DRAWINGS

Other features and advantages of the invention will become apparent with reference to the following description of the drawings.

DETAILED DESCRIPTION

An embodiment according to the present invention provides an electronic device, which includes a display panel, a frame for fixing the display panel and an elastic cover for covering the frame. According to the present invention, the elastic cover is used to form one part of the product housing of the electronic device, that is, the housing of the electronic device according to the embodiment of the present invention is not complete without the elastic cover.

Hereinafter, the specific embodiments of the present invention will be described in detail with reference to the accompanying drawings.

In the following embodiments, the display device will be described as an example of an electronic device applying the present invention. However, it should be understood that the electronic device that the present invention can be applied to is not limited to a display device. It can be further combined with other functions in addition to display to constitute other types of electronic devices, such as TVs, integrated computers. The so-called integrated computer herein refers to a new type of product formed by integrating a host computer, speaker, and the like with a display device in the computer.

Additionally, in the following description the, the display side of the display device will be described as the front side, whereas the opposite side will be described as the rear side. It should be understood that the "front", "rear" described herein are used for the convenience and clarity of the description and are not intended to limit the invention.

Figure 1:
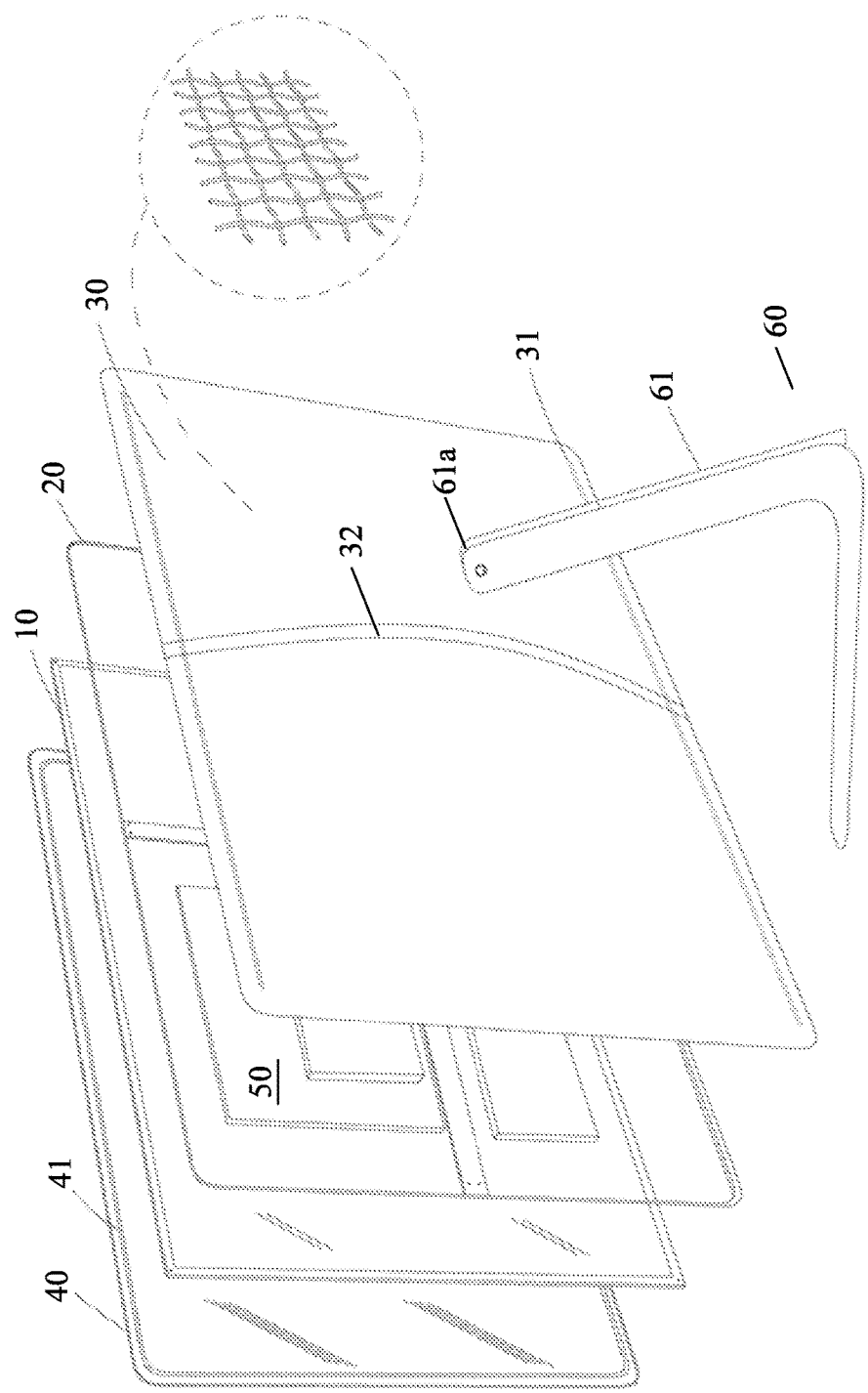
FIG. 1 is an exploded perspective view of a display device according to an embodiment of the present invention.

FIG. 1 shows an exploded perspective view of a display device according to an embodiment of the present invention. As shown in FIG. 1, the display device includes a display panel 10 for displaying an image, a frame 20 for fixing the display panel 10 and an elastic cover 30 covering the rear side (a first side), which is opposite to the display panel, of the frame.

The figure schematically illustrates at least one internal component 50 attached to the display panel 10 or frame 20. The so-called internal components herein refer to the parts that are not expected to be exposed to the outside in the finished product state of the electronic device according to the present invention. Such internal components are, for example, driving circuit boards, speakers, fans, transformers wirings and the like integrated in the electronic device. Embodiments of the present invention are not limited to any particular type of the internal component.

In the illustrated embodiment, the display device further includes the screen glass 40 and the support base 60. The screen glass 40 covers the display panel 10. The screen glass 40 can protect the display panel 10 and help to fix the elastic cover 30, but it is not necessary for the present invention (which will be described hereinafter). The support base 60 is used for place the display device, for example, on the desk.

Compared with the conventional casing made of metal, plastic and so on, the appearance of the elastic cover 30 is lighter and thinner, avoiding the stiff feeling. Further, from the perspective of manufacturing, the elastic cover 30 has the advantages of low cost and being easy to manufacture. Accordingly, more form of elastic covers 30 can be provided to meet the individual needs of different users. Further, the elastic cover 30 can be easily accommodated when it is not in use. The user can arrange a plurality of elastic covers 30 for replacement, when the user buys the display device.

Elastic cover 30 is made of elastic woven materials. The weaving characteristics can provide greater elasticity, to accommodate the deformation requirement of the elastic cover 30. More importantly, the woven holes of the woven material can facilitate the heat and sounds passing through the woven material, so that it can facilitate the cooling and sound transmission of other parts, surrounded or covered by the elastic cover 30, of the display device.

Metal wires can be incorporated into the elastic woven material used for forming elastic covering 30, so that the metal wires in the elastic cover 30 can form a shielding net, which can provide the function of shielding electromagnetic interference for display devices. Thus, it is not necessary to provide a separate shielding member for the display device so that the structure is simplified. In order not to affect the elasticity of the elastic woven material, the metal wires, for example, can be woven in the elastic woven material intermittently and densely in short lines.

Figure 2:
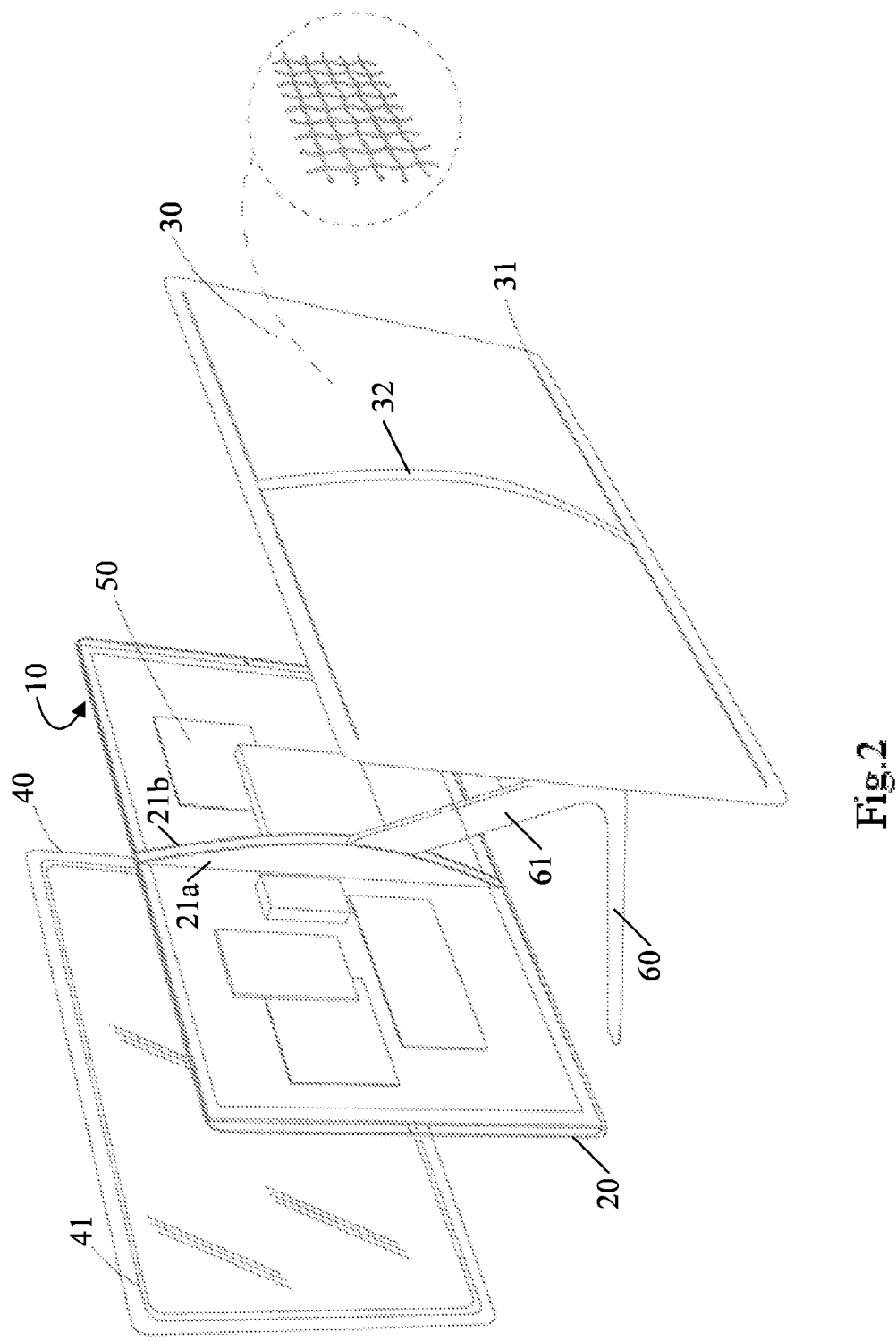
FIG. 2 is a partial assembly perspective view of the display device according to the embodiment showing the state when the display panel, the frame and the support base are assembled together.

FIG. 2 is a partial assembly perspective view of the display device shown in FIG. 1. It shows the state wherein the display panel 10, the frame 20, and the support base 40 are assembled together.

As shown in FIG. 2, when the display panel 10 and the frame 20 are assembled together, at least one internal component 50 attached to the display panel 10 or frame 20 is exposed from the rear side of the frame 20. The frame 20 may have ribs protruding towards the elastic cover 30, which is used for supporting the elastic cover. In one embodiment, as shown in the drawings, the ribs are arranged in the middle of the rear side of the frame 20 and are extended in the longitudinal direction. As shown in FIG. 2, the ribs include two parallel ribs 21a and 21b and a slit is formed between them.

The support base 60 includes a support arm 61 connected to the frame 20. The end part 61a, connecting to the frame 20, of the support arm 61 may be provided with connecting means (not shown), to implement the pivoting and/or movement of the frame 20 and display panel 10 with respect to the support base 60, for example, the pivoting in pitching direction and the movement in the up and down directions. Embodiment of the present invention is not limited to any particular form of a connection mechanism; any suitable attachment mechanism may be used.

In the illustrated embodiment, as shown in FIG. 2, the support arm 61 of the support base 60 is connected to the frame 20 in the slit formed between the two parallel ribs 21a and 21b.

Figure 3:
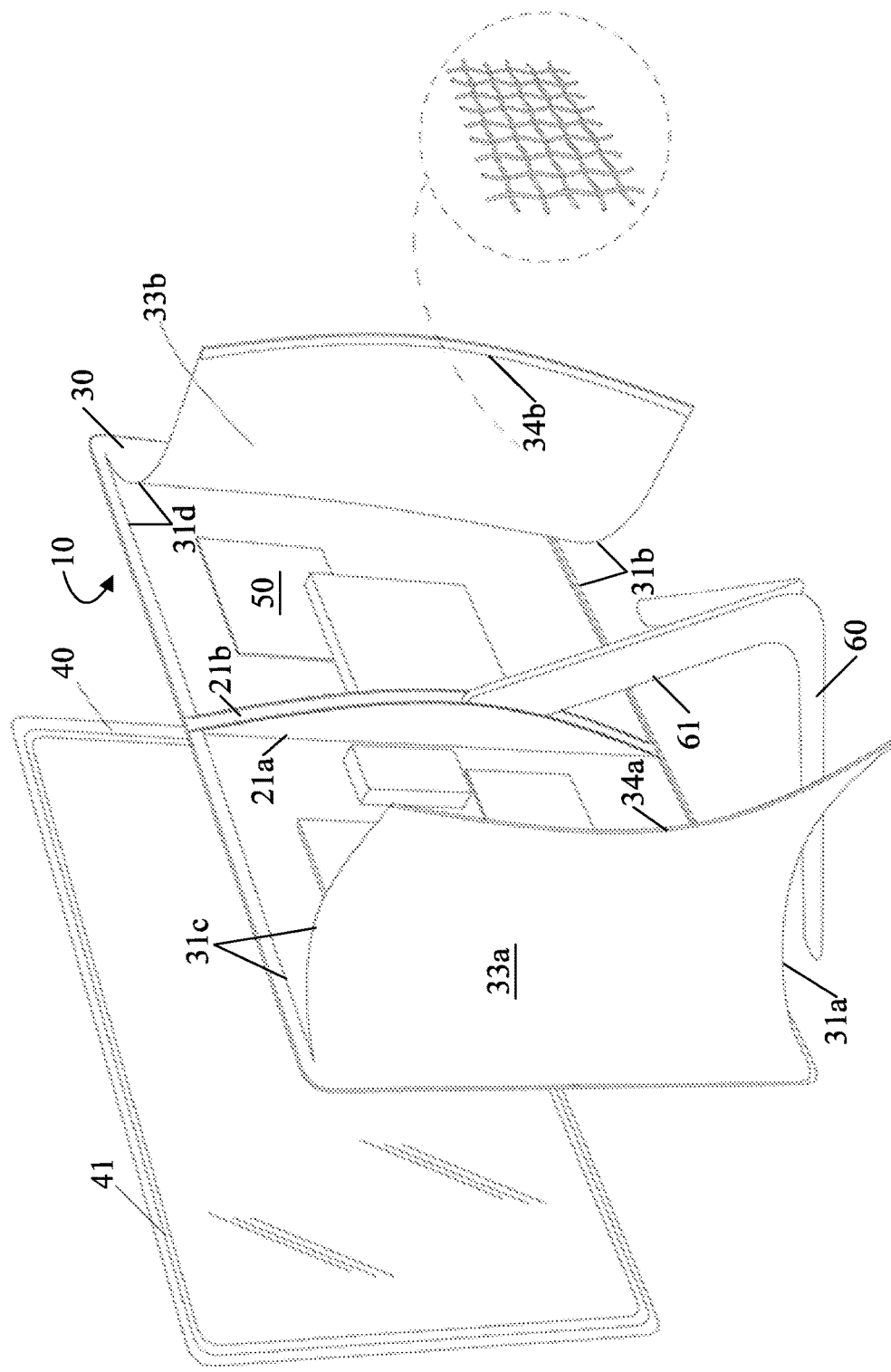
FIG. 3 is a partial assembly perspective view of the display device according to the embodiment, which shows the elastic cover in the state of covering the edge part of the display panel.

FIG. 3 is a partial assembly perspective view of the display device shown in FIG. 1, which shows an elastic cover 30 in the state of covering the edge part of the display panel 10.

As shown in FIG. 3, zippers 31 are provided in the elastic cover 30. The zippers 31 include four zippers 31a, 31b, 31c, and 31d arranged in two parallel lines. The four zippers 31a, 31b, 31c, and 31d have the same lengths and the two zippers 31a and 31b as well as 31c and 31d on the same line are opened in the opposite direction starting from their adjacent positions respectively. The elastic cover 30 is also provided with a slit 32, which connects the respective adjacent positions of the zippers 31a and 31b as well as 31c and 31d. The area of the elastic cover 30 surrounded by the zippers 31a, 31c and the slit 32 forms a first sheet 33a. The area of the elastic cover 30 surrounded by the zippers 31b, 31d and the slit 32 forms a second sheet 33b. Thus, when opening the zippers 31a and 31c, the first sheet 33a may be opened outwards, when opening the zippers 31b and 31d, the second sheet 33b may be opened outwards. When opening the first sheet 33a and/or the second sheet 33b, at least one internal component 50 will be exposed.

Further, in the illustrated embodiment, the braces 34a and 34b are provided respectively at the two opposite edges (i.e. the two edges along the slit 32) of the first sheet 33a and the second sheet 33b of the elastic cover 30. The braces 34a and 34b have certain flexibilities and strengths so that they can be embedded and fixed between the two parallel ribs 21a and 21b of the frame 20.

The elastic cover 30 can cover the display panel 10 and the frame 20 from the front or the rear side in the case that the zippers are opened and the first sheet 33a and the second sheet 33b are opened. In the present embodiment, the elastic cover 30 includes an edge covering part (not shown) covering the edge part of the front side (the second side) of the display panel 10. However, in the case that the frame 20 exposes the edge part at the front of the display panel 10, the edge covering part of the elastic cover 30 can also only cover the edge part of the frame 20 or cover the front side (second side) of the display panel 10 and the frame 20.

Figure 4:
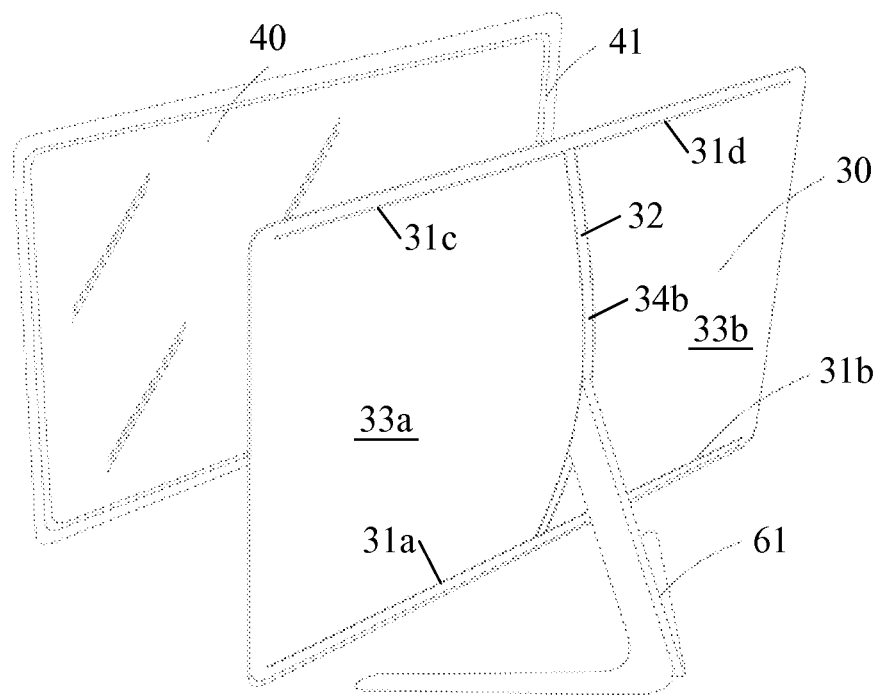
FIG. 4 is a partial assembly perspective view of the display device according to the embodiment, which shows the elastic cover in the state when the zipper of the elastic cover is closed and the screen glass is not mounted.

FIG. 4 shows the state of the display device shown in FIG. 3 after the zipper of the elastic cover is closed. At this time, as shown in FIG. 4, the zipper 31a, 31b, 31c, and 31d are closed and the braces 34a and 34b are inserted and fixed between the two parallel ribs 21a and 21b. The fixation of the braces 34a and 34b between the parallel ribs 21a and 21b can be implement through, for example, the elastic tension of the elastic cover 30 and the position restriction of the ribs 34a and 34b to the braces 34a and 34b. Alternatively, an engagement structure can be arranged on the joint surface of braces and the ribs, such as the convex part formed on one of the braces and the ribs and the concave part formed on the other for holding the convex part. As shown in FIG. 4, the elastic cover 30 covers the rear side of the fame 20 after the zipper is closed and the braces are fixed. In addition, a component accommodating space of the internal components of the display device can be formed between the frame 20 and the elastic cover 30. The at least one internal component 50 of the display device is accommodated in the accommodating space.

In combination with FIG. 3 and FIG. 4, it can be seen that in the display device according to an embodiment of the present invention, the frame expose the at least one internal component of the display device to the side of the elastic cover. The at least one internal component is covered by the elastic cover 30. The elastic cover 30 constitutes a part of the appearance of the display device.

Figure 5:
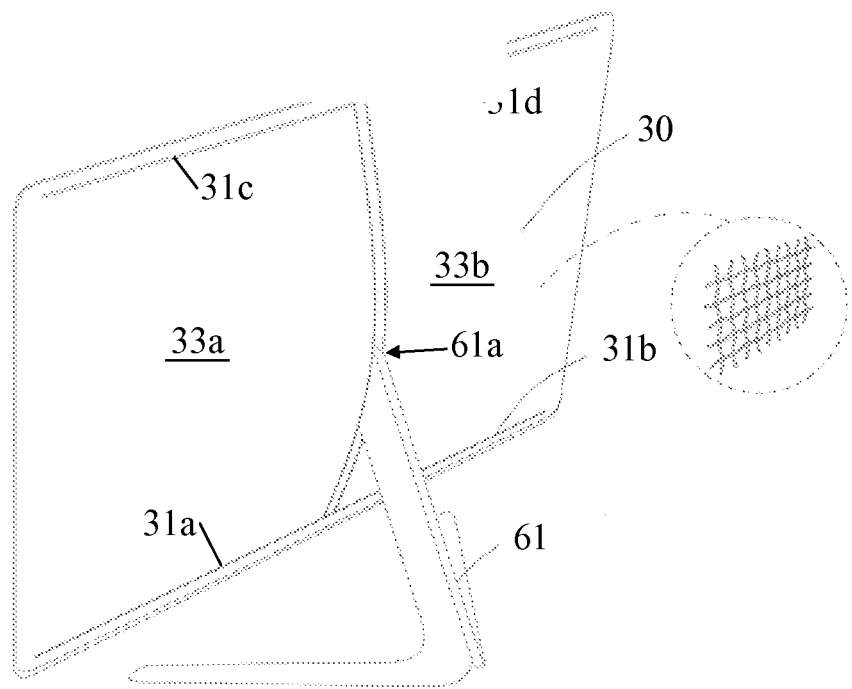
FIG. 5 is a rear perspective view of the display device after the screen glass is assembled.
Figure 6:
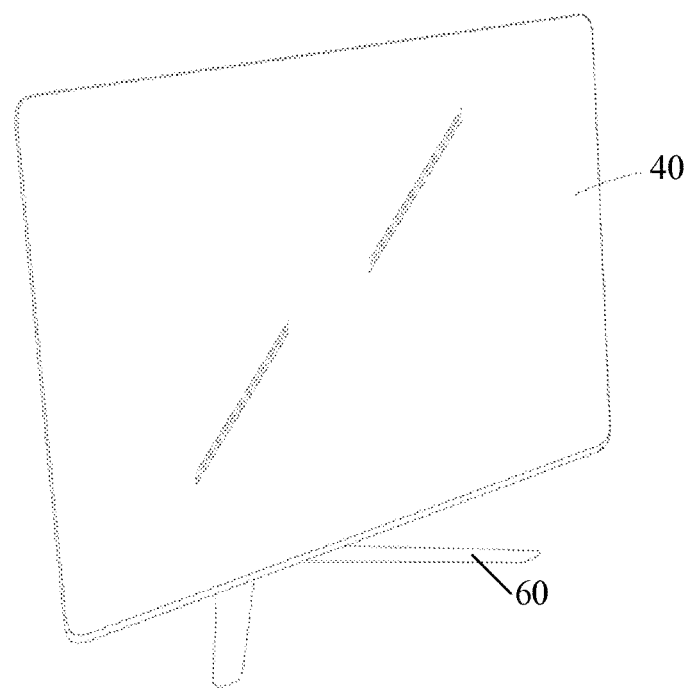
FIG. 6 is a front perspective view of the display device after the screen glass is assembled.

FIG. 5 shows a rear perspective view of the display device after the screen glass is assembled; FIG. 6 shows a front perspective view of the display device at this time.

As shown in the figure, the screen glass 40 covers the display panel 10. As described above, the edge covering part of the elastic cover 30 covers the front edge of the display panel, so when the screen glass 40 covers the display panel 10, the edge covering part is sandwiched between the them. This helps the elastic cover 30 to be fixed in order to prevent the elastic cover 30 from dropping; and the edge covering part of the elastic cover 30 can be hidden to provide a clean appearance.

The screen glass 40 is also fixed to the frame 20. In the shown embodiment, a magnetic strip 41 is attached to edge of the surface of one side of the screen glass 40 that faces the display panel 10 (see FIG. 1 to FIG. 4). The magnetic stripe 41 and the magnetic metal (such as iron) in the frame 20 magnetically attract each other, so that the screen glass 40 is fixed to the frame 20.

However, although not shown, the glass screen 40 may be fixed to the frame by other means. For example, it can be arranged to be pressed onto the front border of the front edge of the screen glass and the front border can be fixed to the frame 20 through a fastener part, such as a screw and the like, thereby fixing the screen glass.

Further, the implementation of the present invention may also not use the screen glass. For example, the front border can be directly pressed against the front edge of the display panel and the edge covering part of the elastic cover is sandwiched between the front border and the display panel. The front border can be fixed to the frame through attracting the metal part in the frame. Alternatively, the front border can be fixed to the frame by fastener part.

Figure 7:
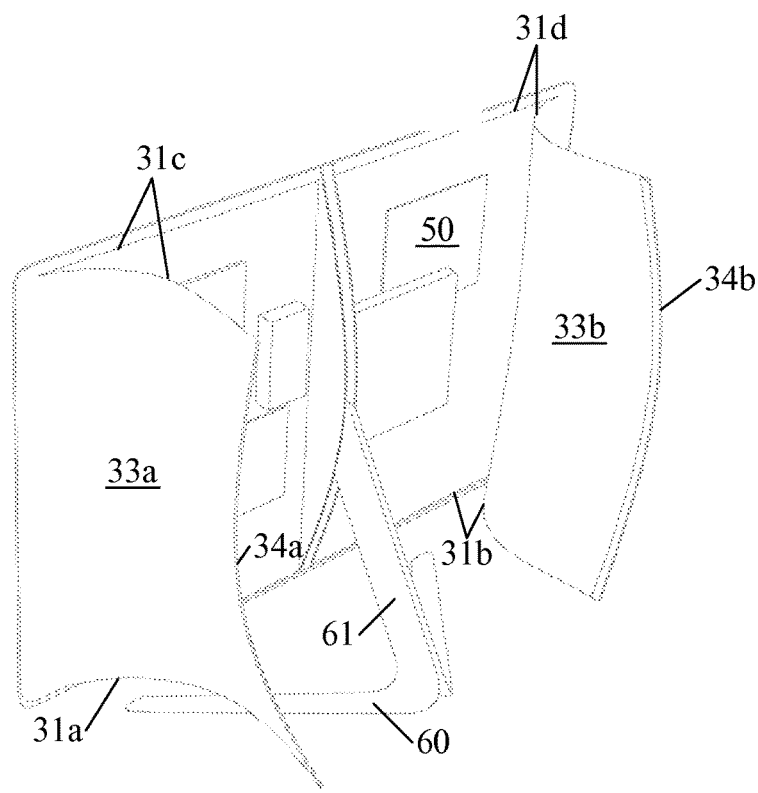
FIG. 7 is a rear perspective view of the display device, showing the state when the zipper of the elastic cover is open to perform internal maintenance.

FIG. 7 is a rear perspective view of the display device, showing that the zippers of the elastic cover are open. According to the display device of an embodiment of the present invention, when malfunction occurs or the internal components need to be upgraded, the first sheet 33a and/or the second sheet 33b can be pulled out by opening the zippers of the elastic cover 30, as shown in FIG. 7. At this time, at least one internal component is exposed when opening the elastic cover 30 without removing other parts of the display device, such as the screen glass 40 and the frame 20 and the like. This makes maintenance and upgrades easy and convenient, and avoids damages due to the removing of the parts of the display device.

Another advantage of the display device of the shown embodiment is that the elastic cover 30 can be easily replaced. Referring back to FIG. 3, when it is desired to replace the elastic cover 30, the front screen glass 40 can be removed by overcoming the magnetic attraction between the magnetic stripe 41 and the frame 20. Moreover, the braces 34a and 34b of the elastic cover 30 can be released from the parallel ribs 21a and 21b of the frame 20. And then each zipper of the elastic cover 30 can be opened, for example, the elastic cover 30 can be stripped from the display surface 10 and the frame 20 from back to the front and then a new elastic cover 30 can be mounted on the display device in the reverse order.

Although in the above embodiment, the elastic cover 30 is provided with zippers arranged in two parallel lines and a slit 32 is provided at a position between the two parallel lines, the present disclosure is not limited to this design of elastic cover 30. For example, the elastic cover 30 can have zippers arranged in the "I"-shape. That is, in the position corresponding to the slit 32, the elastic cover can further use other zippers or other bonding structures by adhesion. Thus, the elastic cover 30 can shield the ribs of the frame 20. The connecting means provided on the end part 61a of the support arm 61 of the support base 60 can also be shielded by other zippers or bonding structures of the elastic cover 30.

Further, it should be understood that the parallel ribs 21a and 21b of frame 20 in the above embodiments are only an example for the ribs provided on the frame for supporting the elastic cover and forming component accommodating space. Alternatively or in addition, ribs at other positions or in other forms can be formed on the frame to support the elastic cover.

Embodiments of the present invention described above with reference to the drawings are exemplary only, and should not be construed as limiting the present invention. The present invention is intended to cover all equivalent technical solutions falling within the scope defined by the appended claims.

What is claimed is:

1. A computer device, the computer device comprising: a display panel; a frame, the display panel fixed to the frame; and an elastic cover, the elastic cover covering a first side and opposite to the display panel of the frame, the elastic cover forming one part of an outer housing of the computer device, wherein the frame supports the elastic cover so that component accommodating space is formed between the elastic cover and the frame; and wherein the electronic device further comprises at least one internal component attached to the display panel or the frame, and the at least one internal component is accommodated in the accommodating space.

2. The computer device of claim 1, wherein the frame exposes the at least one internal component to the elastic cover.

3. The computer device of claim 1, wherein the at least one internal component is shielded by the elastic cover.

4. The computer device of any one of claim 1, wherein the elastic cover is formed by elastic woven material.

5. The computer device of claim 4, wherein the elastic woven material is woven with metal wires.

6. The computer device of any one of claim 1, wherein the frame has ribs protruding towards the elastic cover so as to support the elastic cover.

7. The computer device of claim 4, wherein the elastic cover is provided with zippers.

8. The computer device of claim 7, wherein the zippers comprise four zippers arranged into two parallel lines and the elastic cover is provided with a slit, which connects the respective adjacent positions of the two zippers forming each one of the two parallel lines.

9. The computer device of claim 8, wherein the frame is provided with two parallel ribs protruding towards the elastic cover at a position corresponding to the slit and the ribs support the elastic cover.

10. The computer device of claim 9, wherein the elastic cover has braces provided along each of the two edges of the slit and the braces can be embedded and fixed between the two parallel ribs of the frame.

11. The computer device of claim 10, wherein the electronic device further comprises a support base which comprises a support arm connected to the frame of the display component, and the support arm is connected to the frame between the two parallel ribs.

12. The computer device of claim 7, wherein the zippers are arranged in the "I"-shape.

13. The computer device of claim 12, wherein the frame is provided with two parallel ribs protruding towards the elastic cover at the position corresponding to the "|" of the "I" shape of the zipper arrangement.

14. The computer device of claim 7, wherein the electronic device further comprises a support base which comprises a support arm connected to the frame of the display component, and the support arm penetrates the portion of the elastic cover where the zipper is provided.

15. The computer device of claim 14, wherein the frame of the display component is connected to the support arm of the support base with a connection mechanism and the connection mechanism is covered by the elastic cover.

16. The computer device of claim 1, wherein the elastic cover comprises an edge covering part covering the edge part of the second side, opposite to the first side of the frame, of the display panel or the frame.

17. The computer device of claim 16, wherein the electronic device further comprises screen glass, which covers the display panel so as to sandwich the edge covering part of the elastic cover between the screen glass and the display panel or frame.

18. The computer device of claim 17, wherein a magnetic strip is stuck to the screen glass and the screen glass covers the display panel by magnetic attraction between the magnetic strip and the frame.

* * * * *